(12) United States Patent
Yu et al.

(10) Patent No.: US 7,811,658 B2
(45) Date of Patent: Oct. 12, 2010

(54) HOUSING WITH A SOFT SURFACE

(75) Inventors: Gang-Yang Yu, Shenzhen (CN);
Hsiang-Jung Su, Taipei Hsien (TW);
Wen-Te Lai, Taipei Hsien (TW)

(73) Assignees: ShenZhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 269 days.

(21) Appl. No.: 11/961,283

(22) Filed: Dec. 20, 2007

(65) Prior Publication Data
US 2009/0061176 A1 Mar. 5, 2009

(30) Foreign Application Priority Data
Aug. 31, 2007 (CN) .................. 2007 1 0076749

(51) Int. Cl.
*B32B 9/04* (2006.01)
*B32B 15/04* (2006.01)
*B41M 5/00* (2006.01)
(52) U.S. Cl. .................. 428/204; 428/195.1; 428/209; 427/145

(58) Field of Classification Search .............. None
See application file for complete search history.

(56) References Cited

U.S. PATENT DOCUMENTS

| | | | | | |
|---|---|---|---|---|---|
| 4,557,856 | A | * | 12/1985 | Miyakawa et al. | 252/500 |
| 5,830,938 | A | * | 11/1998 | St. Laurent et al. | 524/317 |
| 5,993,588 | A | * | 11/1999 | Nakamura | 156/212 |
| 2005/0181204 | A1 | * | 8/2005 | Wang et al. | 428/354 |
| 2007/0185299 | A1 | * | 8/2007 | Motonaga et al. | 528/38 |

* cited by examiner

*Primary Examiner*—Betelhem Shewareged
*Assistant Examiner*—Sathavaram I Reddy
(74) *Attorney, Agent, or Firm*—Jeffrey T. Knapp

(57) ABSTRACT

A housing with a soft surface device (100) includes a substrate (10), a primer coating (20) formed on a surface of the substrate, a decorative coating (30) formed on the primer coating, and a top coating (40) formed on the decorative coating and configured for protecting the decorative coating. The primer coating is made of a first resin paint containing a polyamide component. The decorative coating is made of a second resin paint. The top coating is made of a third resin paint. Both the second resin paint and the third resin paint contain an isocyanate polymer and/or reaction products of the isocyanate polymer with hydroxyl groups. A method for making a housing is also provided.

17 Claims, 2 Drawing Sheets

HOUSING WITH A SOFT SURFACE

BACKGROUND OF THE INVENTION

1. Field of the Invention

The present invention relates to housings and, particularly, to a housing with a soft surface.

2. Description of Related Art

Mobile devices, such as mobile telephones, personal digital assistants, or MP3 players, enable consumers to enjoy the convenience of high technology services, anytime and at virtually any location. These mobile devices often employ any of a variety of decorative housings to attract consumers. Paint and ink are typically applied onto surfaces of the housings to provide the necessary decorative appearance. Nowadays, housings, which appear attractive not only to the eye but which also, have attractive tactile characteristics, such as soft housings, are highly desirable. In a typical process for the production of the soft housing, a soft material is employed to cover the housing, so as to form a soft layer on the housing. The soft material used in such processes is typically flexible resin.

However, the typical flexible resin applied onto the housings has a poor adhesion to a metal substrate (e.g., an aluminum substrate) and liable to wear away.

Therefore, a housing with a soft surface is desired in order to overcome the above-described shortcomings.

SUMMARY OF THE INVENTION

In one embodiment thereof, a housing with a soft surface is provided. The housing includes a substrate, a primer coating formed on a surface of the substrate, a decorative coating formed on the primer coating, and a top coating formed on the decorative coating and configured for protecting the decorative coating. The primer coating is made of a first resin paint containing a polyamide component. The decorative coating is made of a second resin paint. The top coating is made of a third resin paint. Both the second resin paint and the third resin paint contain an isocyanate polymer and/or reaction products of the isocyanate polymer with hydroxyl groups.

Other advantages and novel features will become more apparent from the following detailed description of preferred embodiments when taken in conjunction with the accompanying drawings.

BRIEF DESCRIPTION OF THE DRAWINGS

Many aspects of the housing with a soft surface can be better understood with reference to the following drawing. The components in the drawing are not necessarily drawn to scale, the emphasis instead being placed upon clearly illustrating the principles of the housing with a soft surface. Moreover, in the drawing like reference numerals designate corresponding parts throughout the several views.

DETAILED DESCRIPTION OF THE INVENTION

Figure 1:
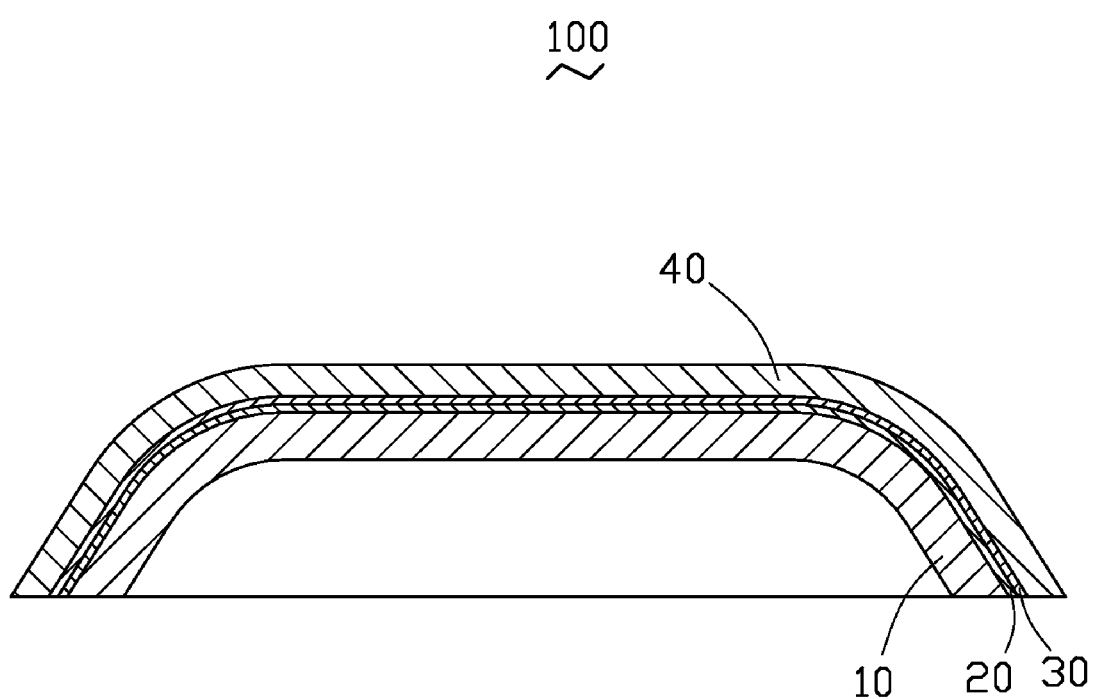
FIG. 1 is a cut-away view of a present embodiment of a housing with a soft surface.

Referring to FIG. 1, in a present embodiment, a housing 100 includes a substrate 10, a primer coating 20 formed on one surface of the substrate 10, a decorative coating 30 formed on the primer coating 20, and a top coating 40 formed on the decorative coating 30 and configured for protecting the decorative coating 30, i.e., the decorative coating 30 is sandwiched between the primer coating 20 and the top coating 40.

The substrate 10 is made of metal selected from the group consisting of aluminum, magnesium, steel, and any alloy thereof.

The primer coating 20 may preferably be made of a first resin paint, which includes at least a polyamide component as major constituent (e.g., about 10% by weight). The first resin paint should preferably further include an epoxy resin component as a major constituent. The first resin paint is a first mixture of a first major agent, a first hardener, and a first thinner. The primer coating 20 may be formed via applying the first mixture onto the substrate 10 and curing the first mixture. The thickness of the primer coating 20 is in an approximate range from 10 μm to 15 μm.

The first major agent includes an epoxy resin component in a portion of about 10 wt % to 30 wt % (percent by weight), an ethylene polymer component in a portion of about 5 wt % to 10 wt %, at least one filler in a portion of about 10 wt % to 30 wt %, a carbon black component in a portion of about 1 wt % to 5 wt %, and solvents in a portion of about 1 wt % to 5 wt % selected from a group including xylenes, 2-butoxy ethanol, methyl isobutyl ketone, toluene, 1,2,4-trimethyl benzene, and ethyl benzene. The first major agent may contain a calcium carbonate filler in a portion of about 10 wt % to 30 wt % and a barium sulfate filler in a portion of about 10 wt % to 30 wt %. The calcium carbonate filler and/or calcium carbonate filler can instead be other fillers used in paint, such as talcum powder and quartz powder.

The first hardener includes a polyamide component in an approximate portion of 10 wt % to 30 wt %, propyl alcohol in an approximate portion of 10 wt % to 30 wt %, xylenes in an approximate portion of 10 wt % to 30 wt %, aromatic naphtha in an approximate portion of 7 wt % to 13 wt %, 2-butoxy ethanol in an approximate portion of 5 wt % to 10 wt %, isopropyl alcohol in an approximate portion of 3 wt % to 7 wt %, and 1,2,4-trimethyl benzene in an approximate portion of 3 wt % to 7 wt %.

The first thinner can be a volatile organic solvent to keep the epoxy resin component of the first major agent and the polyamide component of the first hardener in solution until reacted. The first thinner preferably includes 2-methoxypropyl acetate in an approximate portion of 25 wt % to 50 wt %, light aliphatic in an approximate portion of 10 wt % to 25 wt %, ethyl methyl ketone in an approximate portion of 10 wt % to 25 wt %, xylene in an approximate portion of 2.5 wt % to 10 wt %, ethylbenzene in an approximate portion of 1 wt % to 2.5 wt %, and 2-methoxypropyl acetate in an approximate portion of 0.1 wt % to 1 wt %.

The weight ratio of the first major agent, the first hardener, to the first thinner is 1 to 3:0.5 to 1.5:0.2 to 1.2. The weight ratio of the first major agent, the first hardener, to the first thinner should preferably be 2:1:0.5 to 1.5. The epoxy resin component of the first major agent and the polyamide component of the first hardener are cross-linked together during curing the first mixture of the first major agent, the first hardener, and the first thinner, thereby improving the adhesion of the primer coating 20 to the substrate 10.

The decorative coating 30 is made of a second resin paint, which includes an isocyanate polymer and/or reaction products of the isocyanate polymer with hydroxyl groups as major constituent. The second resin paint is a second mixture of a second major agent, a second hardener, and a second thinner. The decorative coating 30 may be formed via applying the second mixture onto the primer coating 20 and curing the mixture. The thickness of the decorative coating 30 is in an approximate range from 10 μm to 15 μm.

The second major agent includes at least one ketone-based solvent, at least one acetate-based ester component, and a pigment. The ketone-based solvent may be dimethyl ketone, methyl isobutyl ketone, methyl ethyl ketone, or a mixture thereof. The acetate-based ester component may be butyl acetate, ethyl acetate, and/or a mixture thereof. The pigment may be an organic pigment.

The second hardener includes at least an isocyanate polymer, which should preferably be polyhexamethylene diisocyanate. The second hardener, for example, includes the polyhexamethylene diisocyanate in an approximate portion of 65 wt % to 75 wt %, butyl acetate in an approximate portion of 5 wt % to 15 wt %, aromatic solvent in an approximate portion of 5 wt % to 15 wt %, 1,2,4-trimethylbenzene in an approximate portion of 1 wt % to 5 wt %, and isopropyl benzene less than 1 wt %.

The second thinner includes methyl ethyl ketone in an approximate portion of 55 wt % to 65 wt %, 2-heptanone in an approximate portion of 15 wt % to 25 wt %, 2-butoxyethanol in an approximate portion of 5 wt % to 15 wt %, and a catalyst less than 1 wt %. The 2-butoxyethanol can instead be any of other hydroxyl components. The catalyst is usually employed in the second thinner to speed up a chemical reaction between the isocyanate polymer and hydroxyl function groups, which may be contained in 2-butoxyethanol, butyl acetate, and ethyl acetate, at a temperature less than 80° C. The catalyst can be dibutyl tin dilaurate, tertiary amines, or other suitable organometallic catalysts.

The weight ratio of the second major agent, the second hardener, to the second thinner is 90 to 110:5 to 10:70 to 120 and preferably be 100:8:80 to 110. The isocyanate polymer and/or the reaction products of the isocyanate polymer with the hydroxyl function groups are partially cross-linked to the epoxy resin component and the polyamide component contained in the primer coating 20, thereby improving the adhesion of the decorative coating 30 to the primer coating 20.

The top coating 40 is made of a third resin paint, which includes an isocyanate polymer and/or reaction products of the isocyanate polymer with hydroxyl groups as major constituent. The third resin paint a second mixture of a third major agent, a third hardener, and a third thinner. The top coating 40 may be formed via applying the third mixture onto decorative coating 30 and curing the mixture. The thickness of the top coating 40 is in an approximate range from 40 μm to 60 μm.

The third major agent can be a mixture of butyl acetate, xylene, ethyl benzene, and dibutyl tin dilaurate. The third hardener is the same as the second hardener. The third thinner includes ethyl acetate in an approximate portion of 45 wt % to 55 wt % and toluene in an approximate portion of 45 wt % to 55 wt %.

The weight ratio of the second major agent, the second hardener, to the second thinner may be 90 to 110:15 to 30:15 to 60 and preferably be 100:22:20 to 50. The isocyanate polymer and/or the reaction products thereof contained in the top coating 40 may be partially cross-linked to the isocyanate polymer and/or the reaction products thereof contained in the decorative coating 30, thereby improving the adhesion of the top coating 40 to the decorative coating 30.

Figure 2:
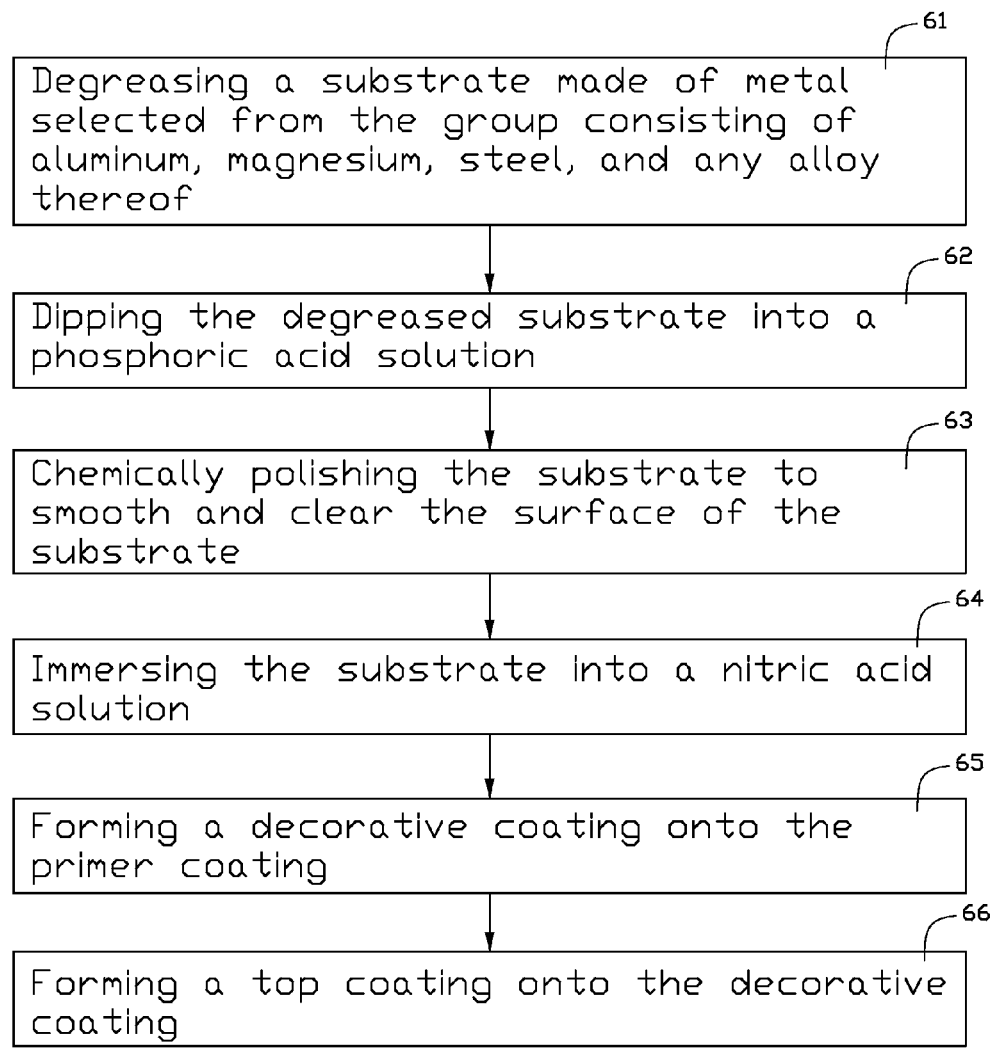
FIG. 2 is a flow chart of a present embodiment of a method for making the housing shown in FIG. 1.

Referring to FIG. 2, a method for making the housing 100 is provided. In a first step 61 of the method for making the housing 100, a process for degreasing a substrate made of metal selected from the group consisting of aluminum, magnesium, steel, and any alloy thereof. The degreasing process is carried out using, advantageously, an alkali-based degreasing agent, in order to smoothen and clean the surface of the substrate 10. After being degreased, the substrate 10 is subsequently rinsed in flowing water. It is to be understood that, additionally or alternatively, other degreasing agents, such as surfactants, could be employed in the first step of the method.

In a second step 62 of the method, the substrate 10 is dipped into a phosphoric acid solution in a concentration more than 1.4 g/ml (gram per milliliter) for 5 to 10 seconds.

In a third step 63 of the method, the substrate 10 is chemically polished, in order to smooth and clear the surface of the substrate 10. During the chemical polishing step, the substrate 10 is immersed into a chemical polishing solution containing about 0.9 g/ml to 1.3 g/ml phosphoric acid and about 0.25 g/ml to 0.4 g/ml sulfuric acid for 20 to 30 seconds at a temperature of 90 to 110° C. It is to be further understood that a chemical-mechanical polishing (CMP) step, as well, is considered to be within the scope of the present chemical polishing step.

In a fourth step 64 of the method, the substrate 10 is rinsed in water and then immersed into a nitric acid solution for 8 to 20 seconds to remove metal oxides generated in the polishing step. The volume concentration of the nitric acid solution is about 20% to 40%.

In a fifth step 65 of the method, the substrate 10 is rinsed in water and then dried in a oven.

In a sixth step 66 of the method, the substrate 10 is coated with the primer coating 20 via a first spraying process. During the first spraying process, the first mixture is atomized and sprayed onto the surface of the substrate 10 to form the primer coating 20 with a thickness in an approximate range from 10 μm to 15 μm. The atomization pressure of the mixture is in an approximate range from 0.23 to 0.39 million Pa. After the first spraying process, the primer coating 20 is leveled and cured at a temperature in an approximate range from 70° C. to 100° C., beneficially, from 75° C. to 85° C.

In a seventh step 67 of the method, the second mixture of the second resin paint is applied onto the primer coating 20 via a second spraying process to form the decorative coating 30 s. During the second spraying process, the second mixture is atomized and sprayed onto the primer coating 20 to form the decorative coating 30 with a thickness in an approximate range from 10 μm to 15 μm. After the second spraying process, the decorative coating 30 is leveled and cured at a temperature in an approximate range from 50° C. to 90° C., beneficially, from 60° C. to 80° C.

In an eighth step 68 of the method, the third mixture of the third resin paint is applied onto the decorative coating 30 via a third spraying process to form the top coating 40. During the third spraying process, the third mixture is atomized and sprayed onto the decorative coating 30 to form the top coating 40 with a thickness in an approximate range from 40 μm to 60 μm. After the third spraying process, the top coating 40 is leveled and cured at a temperature in an approximate range from 70° C. to 100° C., beneficially, from 80° C. to 90° C. As such, the housing 100 is obtained.

The housing 100 prepared via the above method has a smooth, shiny, and lustrous surface. The housing 100 has undergone the following tests. In a first test, the housing 100 is tested for thermal shock resistance. The test is carried out by twenty-seven thermal shock cycles onto the housing 100. Each thermal shock cycle is performed by placing the housing 100 into a first chamber at a temperature of −40° C. for several minutes, then rapidly transferring the housing 100 into a second chamber at a temperature of 85° C. to heat the housing 100 for more then one minute, and finally placing the housing back into the first chamber at the temperature of −40° C. No cracking, blistering, or peeling of the primer coating 20, the decorative coating 30, and the top coating 40 of the housing 100 is observed.

In a second test, the housing 100 is tested for high temperature resistance and high humidity resistance by placing the housing into a third chamber at a temperature of 60° C. and at a humidity of 90% RH for 88 hours. No cracking, blistering, or peeling of the primer coating 20, the decorative coating 30, and the top coating 40 of the housing 100 is observed.

In a third test, the housing 100 is coated with suntan oil and then placed into into the third chamber at a temperature of 60° C. and at a humidity of 90% RH for 48 hours. No cracking, blistering, or peeling of the primer coating 20, the decorative coating 30, and the top coating 40 of the housing 100 is observed.

In a fourth test, the housing 100, which had been tested in the first test, the second test, and the third test, is tested for coating adhesion by using a cross-cut tester to score the surface of the housing 100. The test result shows that the primer coating 20, the decorative coating 30, and the top coating 40 of the housing 100 has a coating adhesion of 5B.

In a fifth test, the housing 100, which had been tested in the first test, the second test, and the third test, is tested for coating hardness by method of a pencil test using a pencil tester to score the surface of the housing 100 at an angle of 45° and under 500 gf (gram-force). The test result shows that the coating hardness of the coatings including the primer coating 20, the decorative coating 30, and the top coating 40, is HB in the pencil test.

In a sixth test, the housing 100 is tested for solvent resistance by immersing the housing into an organic solvent, e.g. butanone, for 2 minutes. No change of the surface of the housing 100 is observed.

From the above tests, the coatings of the housing 100 including the primer coating 20, the decorative coating 30, and the top coating 40 are shown to have improved adhesion under high moisture and high temperature, high thermal shock resistance, high hardness, and high chemical solvent resistance.

It should be also understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A housing with a soft surface, comprising:
   a substrate;
   a primer coating formed on a surface of the substrate, the primer coating being made of a first resin paint, the first resin paint being a first mixture of a first major agent including an epoxy resin component, a first hardener including a polyamide component, and a first thinner including organic solvents, the epoxy resin component being in a portion of about 10 wt % to 30 wt % of the first major agent, the first major agent further including at least one filler in a portion of about 10 wt % to 30 wt %, and solvents in a portion of about 1 wt % to 5 wt % selected from a group consisting of xylenes, 2-butoxy ethanol, methyl isobutyl ketone, toluene, 1,2,4-trimethyl benzene, and ethyl benzene;
   a decorative coating formed on the primer coating, the decorative coating being made of a second resin paint; and
   a top coating formed on the decorative coating and configured for protecting the decorative coating, the top coating being made of a third resin paint;
   wherein both the second resin paint and the third resin paint contain an isocyanate polymer, reaction products of the isocyanate polymer with hydroxyl groups, or an isocyanate polymer and reaction products of the isocyanate polymer with hydroxyl groups.

2. The housing as claimed in claim 1, wherein the substrate is made of a metal selected from the group consisting of aluminum, magnesium, steel, and any alloy thereof.

3. The housing as claimed in claim 1, wherein the at least one filler may be one of a calcium carbonate filler, a barium sulfate filler, a talcum powder filler, and a quartz powder filler.

4. The housing as claimed in claim 1, wherein the first major agent further includes an ethylene polymer component in a portion of about 5 wt % to 10 wt % and an carbon black component in a portion of about 1 wt % to 5 wt %.

5. The housing as claimed in claim 1, wherein the polyamide component is in a portion of about 10 wt % to 30 wt % of the first hardener, the first hardener further including propyl alcohol in a portion of about 10 wt % to 30 wt %, xylenes in a portion of about 10 wt % to 30 wt %, aromatic naphtha in a portion of about 7 wt % to 13 wt %, 2-butoxy ethanol in a portion of about 5 wt % to 10 wt %, isopropyl alcohol in a portion of about 3 wt % to 7 wt %, and 1,2,4-trimethyl benzene in a portion of about 3 wt % to 7 wt %.

6. The housing as claimed in claim 1, wherein the first thinner includes 2-methoxypropyl acetate in a portion of about 25 wt % to 50 wt %, light aliphatic in a portion of about 10 wt % to 25 wt %, ethyl methyl ketone in a portion of about 10 wt % to 25 wt %, xylene in a portion of about 2.5 wt % to 10 wt %, ethylbenzene in a portion of about 1 wt % to 2.5 wt %, and 2-methoxypropyl acetate in a portion of about 0.1 wt % to 1 wt %.

7. The housing as claimed in claim 1, wherein the isocyanate polymer is polyhexamethylene diisocyanate.

8. The housing as claimed in claim 7, wherein the second resin paint is a second mixture of a second major agent including solvents, a second hardener including the polyhexamethylene diisocyanate component, and a second thinner including at least one hydroxyl component.

9. The housing as claimed in claim 8, wherein the second major agent includes at least one ketone-based solvent and at least one acetate-based solvent.

10. The housing as claimed in claim 8, wherein the polyhexamethylene diisocyanate component is in a portion of about 65 wt % to 75 wt % of the second hardener, the second hardener further including butyl acetate in a portion of about 5 wt % to 15 wt %, aromatic solvent in a portion of about 5 wt % to 15 wt %, 1,2,4-trimethylbenzene in a portion of about 1 wt % to 5 wt %, and isopropyl benzene less than 1 wt %.

11. The housing as claimed in claim 8, wherein the second thinner includes methyl ethyl ketone in a portion of about 55 wt % to 65 wt %, 2-heptanone in a portion of about 15 wt % to 25 wt %, 2-butoxyethanol in a portion of about 5 wt % to 15 wt %, and a catalyst less than 1 wt %.

12. The housing as claimed in claim 1, wherein the third resin paint is a third mixture of a third major agent including at least one hydroxyl component, a third hardener including the isocyanate polymer, and a third thinner including solvents.

13. The housing as claimed in claim 12, wherein the third major agent is a mixture of butyl acetate, xylene, ethyl benzene, and dibutyl tin dilaurate.

14. The housing as claimed in claim 12, wherein the isocyanate polymer is polyhexamethylene diisocyanate.

15. The housing as claimed in claim 14, wherein the polyhexamethylene diisocyanate component in a portion of about 65 wt % to 75 wt % of the third hardener, the third hardener further including butyl acetate in a portion of about 5 wt % to 15 wt %, aromatic solvent in a portion of about 5 wt % to 15 wt %, 1,2,4-trimethylbenzene in a portion of 1 about wt % to 5 wt %, and isopropyl benzene less than 1 wt %.

16. The housing as claimed in claim 12, wherein the third thinner includes ethyl acetate in a portion of about 45 wt % to 55 wt % and toluene in a portion of about 45 wt % to 55 wt %.

17. A housing with a soft surface, comprising:
a substrate
a primer coating formed on a surface of the substrate, the primer coating being made of a first resin paint containing a polyamide component and an epoxy resin component;
wherein the first resin paint is a first mixture of a first major agent including the epoxy resin component, a first hardener including the polyamide component, and a first thinner including organic solvents;
wherein the epoxy resin component is in a portion of about 10 wt % to 30 wt % of the first major agent, the first major agent further including at least one filler in a portion of about 10 wt % to 30 wt %, and solvents in a portion of about 1 wt % to 5 wt % selected from the group consisting of xylenes, 2-butoxy ethanol, methyl isobutyl ketone, toluene, 1,2,4-trimethyl benzene, and ethyl benzene;
a decorative coating formed on the primer coating, the decorative coating being made of a second resin paint; and
a top coating formed on the decorative coating and configured for protecting the decorative coating, the top coating being made of a third resin paint;
wherein both the second resin paint and the third resin paint contain an isocyanate polymer, reaction products of the isocyanate polymer with hydroxyl groups, or an isocyanate polymer and reaction products of the isocyanate polymer with hydroxyl groups, the isocyanate polymer and the reaction products thereof contained in the top coating are partially cross-linked to the isocyanate polymer and the reaction products thereof contained in the decorative coating.

* * * * *